United States Patent
Zhu et al.

(10) Patent No.: US 7,655,989 B2
(45) Date of Patent: Feb. 2, 2010

(54) TRIPLE GATE AND DOUBLE GATE FINFETS WITH DIFFERENT VERTICAL DIMENSION FINS

(75) Inventors: Huilong Zhu, Poughkeepsie, NY (US); Yue Tan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 11/564,961

(22) Filed: Nov. 30, 2006

(65) Prior Publication Data

US 2008/0128796 A1 Jun. 5, 2008

(51) Int. Cl.
*H01L 29/72* (2006.01)

(52) U.S. Cl. .................. 257/401; 257/288; 257/347; 257/368

(58) Field of Classification Search ............ 257/288, 257/347, 368, 401
See application file for complete search history.

(56) References Cited

U.S. PATENT DOCUMENTS 7,214,991 B2 * 5/2007 Yeo et al. .............. 257/401

2004/0222477 A1 11/2004 Aller et al.
2005/0199919 A1 * 9/2005 Liu et al. ............... 257/288
2005/0239242 A1 * 10/2005 Zhu et al. ............... 438/199

OTHER PUBLICATIONS

Yang, Jeong-Hwan, et al., "Fully Working 1.25UM2 6T-SRAM Cell with 45nm Gate Length Triple Gate Transistors", IEDM Tech. Dig., 2003, pp. 23-26.

* cited by examiner

*Primary Examiner*—Edward Wojciechowicz
(74) *Attorney, Agent, or Firm*—Scully, Scott, Murphy & Presser, P.C.; Yuanmin Cai

(57) ABSTRACT

A semiconductor structure and its method of fabrication include multiple finFETs with different vertical dimensions for the semiconductor fins. An implant species is implanted in a bottom portion of selected semiconductor fins on which reduced vertical dimension is desired. The bottom portion of the selected semiconductor fins with implant species is etched selective to the semiconductor material without the implanted species, i.e., the semiconductor material in the top portion of the semiconductor fin and other semiconductor fins without the implanted species. FinFETs with the full vertical dimension fins and a high on-current and finFETs with reduced vertical dimension fins with a low on-current thus results on the same semiconductor substrate. By adjusting the depth of the implant species, the vertical dimension of the semiconductor fins may be adjusted in selected finFETs.

18 Claims, 15 Drawing Sheets

TRIPLE GATE AND DOUBLE GATE FINFETS WITH DIFFERENT VERTICAL DIMENSION FINS

FIELD OF THE INVENTION

The present invention relates to semiconductor devices, and particularly, to finFET devices.

BACKGROUND OF THE INVENTION

A FinFET transistor is a MOSFET transistor in which a gate electrode is placed on two, three, or four sides of a channel or is wrapped around the channel, with a gate dielectric separating the gate electrode and the channel. A double gate finFET utilizes a double gate configuration in which the gate electrode is placed on two opposite sides of the channel. In a triple gate finFET, the gate electrode is placed on one more side of a typically rectangular channel of the transistor. In a quadruple gate finFET or a wrapped gate finFET, the gate electrode is placed on four sides of the channel. The increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. These devices have been given the generic name "finFETs" because fin sidewalls are used to form a MOSFET. A finFET device has faster switching times, equivalent or higher current density, and much improved short channel control than the mainstream CMOS technology utilizing similar critical dimensions.

In a typical finFET structure, at least one horizontal channel on a vertical sidewall is provided within a semiconductor "fin" that is set sideways, or edgewise, upon a substrate. Typically, the fin comprises a single crystalline semiconductor material with a substantially rectangular cross-sectional area. Typically, the height of the fin is greater than width of the fin to enable higher on-current per unit area of semiconductor area used for the finFET structure. In order to obtain desirable control of short channel effects (SCEs), the semiconductor fin is thin enough in a device channel region to ensure forming fully depleted semiconductor devices. Typically, the thickness, or the horizontal width, of a fin in a finFET is less than two-thirds of its gate length in order to obtain good control of the short channel effect.

An inverted U-shaped gate electrode often straddles a central section of the semiconductor fin and covers the gate dielectric layers. In a typical double gate finFET, a gate dielectric layer and a gate conductor are located upon each of the two semiconductor fin sidewalls facing each other. A spacer material of substantial thickness is located between the top surface of the fin and the top portion of the inverted U-shaped gate electrode such that the top surface of the fin is not controlled directly by the portion of the gate electrode above it. In a typical triple gate finFET, a gate electrode of an inverted U shape is typically located upon the two semiconductor fin sidewalls and also upon the top surface of the fin structure. The top surface of the fin is separated from the top portion of the gate electrode only by a gate dielectric layer and is thus controlled by the gate electrode. Ion implantations are performed on the source and drain regions, which are the end portions of the semiconductor fin, to deliver halo, extension, and source/drain doping while using the gate electrode or other masking layer as a mask.

While providing improved MOSFET performance, the finFETs, however, pose unique design challenges. While planar MOSFET devices have virtually no limit on the width of the device above the lithographical minimum dimension and therefore, the size of planar MOSFETs may be adjusted arbitrarily, typical finFETs have identical vertical dimensions for the fins, thereby limiting the size of the finFET to integer multiples of a minimum size finFET for a given channel length. In other words, for the control of the on-current and the off-current of transistors, planar MOSFETs provide two parameters, which are the width, W and the length, L of the channel but finFETs provide only one parameter, which is the length, L of the finFET since the height of the fin, and consequently the width of the channel is fixed for all finFETs. Therefore, for a given transistor length, L, which defines the ratio of the on-current to off-current, the amount of on-current from an individual fin is fixed. Using multiple fins for a finFET provide integer multiples for the total current but non-integer fractions or non-integer multiples of the on-current of an individual fin requires non-obvious or elaborate processing schemes and/or structures. Also, the use of multiple fins tends to use more silicon surface area and makes the device design less area-efficient.

However, transistors with different on-currents are often required in the design of high performance integrated circuits. One such example is a six-transistor SRAM cell, wherein the beta ratio (the ratio of the on-current of a pull-down NFET to the on-current of a pass gate NFET) needs to be kept close to 2 for optimal performance of the SRAM cell.

While it is possible to change the length of finFET devices to reduce the on-current of a finFET as exemplified in Yang et al., "Fully Working 1.25 mm2 6T-SRAM cell with 45 nm gate length Triple Gate Transistors," IEDM Tech. Dig., 2003, pp. 23-26, the use of longer channel lengths not only consumes more silicon substrate area, but also introduces variables in terms of the variability of the physical dimensions of the gate lengths due to the complexities of optical proximity correction. In addition, different gate lengths give different short channel effect, which can cause threshold voltage mismatching or ratio variation induced by Vdd variation.

Another approach by Aller et al., in U.S. Patent Application Publication No. 2004/0222477 A1 discloses a finFET device provided with a first semiconductor fin and a second semiconductor fin with different heights and adjustments on the ratio of the height of the first semiconductor fin to that of the second semiconductor fin are used to tune the performance of the transistor. However, the use of a thermal oxidation process to reduce the height of the fin requires that a hardmask be used in this process. Many processing steps are necessary such as deposition of a hardmask material, application and lithographic patterning of a photoresist, a transfer of a lithographic pattern into the hardmask, and thermal oxidation. The oxidation raises surface level due to volume expansion caused by the oxidation, which causes vertical variation in the height of the substrate which reduces usable depth of focus during subsequent lithographic process and may cause CD variations in the printed lithographic images.

Therefore, there exists a need for a semiconductor structure and a manufacturing process that produces multiple vertical dimensions for the fins on the same semiconductor wafer. Also, there exists a need for a semiconductor manufacturing process that uses a minimal number of extra processing steps, which are simple and inexpensive.

Also, there exists a need for a dense CMOS circuitry through the use of multiple finFETs with different vertical dimensions for the fins.

SUMMARY OF THE INVENTION

The present invention addresses the needs described above and provides structures and methods of forming finFET devices of multiple vertical dimensions for the fins with a small number of additional processing steps that are simple and inexpensive.

Furthermore, the present invention enables design of a dense high performance CMOS device by providing multiple vertical dimensions for the fins of finFET devices.

While more than two different vertical dimensions for the fins are enabled according to the present invention, the present invention is herein described with two types of semiconductor fins with different vertical dimensions for the fins. Application of the present invention to more than two types of semiconductor fins is straightforward and requires only additional masks and implantation processes.

Initially, both the first type semiconductor fins and the second type semiconductor fins are identical in height. Both types of semiconductor fins are provided with a substantially flat top surface. Both types of semiconductor fins have the same height for the substantially flat top surface. Preferably, the cross-sectional areas of both types of semiconductor fins are rectangular. In the case of rectangular semiconductor fins, both types of semiconductor fins have the same height for the bottom surface of the semiconductor fins. More preferably, the height of the semiconductor fins is greater than the width of the semiconductor fins in both types of semiconductor fins. Optionally, an insulator layer may be formed on and above the top surface of each semiconductor fin.

According to the present invention, the top surface of the semiconductor is coated with a photoresist and patterned such that the second type semiconductor fins are not covered with the patterned photoresist while the first type of fins are covered with the patterned photoresist. An implant species is implanted into a portion of the second type semiconductor fins such that a top portion of the second type semiconductor fins comprises substantially the same semiconductor material as before the implant while a bottom portion of the second type semiconductor fins comprises an alloy of the implant species and the original semiconductor material for the second type semiconductor fins. Preferably, the patterned photoresist is removed thereafter.

Alternatively, the implantation of the implant species may precede the formation of the semiconductor fins. In this case, prior to the formation of semiconductor fins, a photoresist is applied and patterned such that the resist covers the first area wherein the first type semiconductor fins are to be formed and the photoresist does not cover the second area wherein the second type semiconductor fins are to be formed. The implant species is implanted into the bottom portion of the semiconductor material in the second area, followed by the removal of the photoresist. Patterning of the semiconductor fins of both types with another step of photolithography and reactive ion etching (RIE) produces first type semiconductor fins without any implanted portion and second type semiconductor fins with a bottom portion containing an alloy of the implant species and a semiconductor material.

In a selective etch process following the implantation or the photoresist removal, the bottom portion of the second type semiconductor fins with the implanted species is etched and removed selective to the original semiconductor material in the top portion of the second type semiconductor fins and the semiconductor material in the first type semiconductor fins. In other words, the bottom portion of the second type semiconductor fins comprising an alloy of the implant species and the original semiconductor material for the second type semiconductor fins is etched, while the top portion of the second type semiconductor fins, comprising substantially the same semiconductor material as before the implant, and the semiconductor material in the first type semiconductor fins are not etched in any substantial manner.

Preferably, a dielectric material is then deposited to fill the space between the bottom surface of the second type semiconductor fins and the semiconductor substrate. The dielectric material on the sidewalls is etched thereafter either by a wet etch or by a reactive ion etch (RIE). Preferably, the dielectric material on the sidewalls is etched by a reactive ion etch (RIE). The height of the bottom of the dielectric material under the semiconductor fins of the second type is the same as the height of the bottom of the first semiconductor fins of the first type and is the same as the top surface of the underlying semiconductor substrate.

A gate dielectric is formed either by deposition or growth on the sidewalls of the semiconductor fins of both types followed by deposition and patterning of a gate conductor stack to form a gate electrode. If a thick insulator layer is disposed on and above the top surfaces of the semiconductor fins, a double gate finFET structure results wherein the gate control is affected only by the two sections of the gate electrode located on the gate dielectric on the two sidewalls of each of the finFETs. If an insulator layer is not disposed on and above the top surfaces of the semiconductor fins, a triple gate finFET structure results wherein the gate control is affected by the three sections of the gate electrode contacting the gate dielectric, which are located on the two sidewalls and the top surface of a finFET.

As a specific example of an application of the present invention, two n-type finFETs wherein the first NFET with a first fin has a full vertical dimension for the first fin and a second NFET with a second fin has about 50% of the full vertical dimension for the second fin are formed such that the first fin and the second fin are adjoined end to end in an SRAM design. The first n-type finFET is used for a pull down NFET and the second n-type finFET is used as a pass gate NFET in an SRAM cell. The ratio of about 2 between the vertical dimensions of these two finFETS enables the design of the two finEFTs with the same gate length and the same fin width while maintaining a beta ratio of about 2. By adjusting the depth of the implant for the implant species and consequently the amount of removal of the semiconductor material from the second type semiconductor fins, the beta ratio can easily be tuned for optimal SRAM design.

Similar benefits of the present invention can readily be extended to other circuits that can utilize different amount of on-current for different finFET devices.

BRIEF DESCRIPTION OF THE DRAWINGS

FIGS. 3A-7A are top down views of the SRAM structure utilizing finFETs with different vertical dimensions for the fins according to the present invention at various stages of processing steps.

FIGS. 3B-7B are cross-sectional views of the SRAM structure utilizing finFETs according to the present invention at various stages of processing steps along the line B-B' in respective top-down views.

FIGS. 3C-7C are cross-sectional views of the SRAM structure utilizing finFETs according to the present invention at various stages of processing steps along the line C-C' in respective top-down views.

FIGS. 3D-7D are cross-sectional views of the SRAM structure utilizing finFETs according to the present invention at various stages of processing steps along the line D-D' in respective top-down views.

DETAILED DESCRIPTION OF THE INVENTION

Before describing the present invention in detail, a discussion on the prior SRAM structures is provided. The discussion on the prior SRAM structures is made herein to clearly illustrate the advantages provided by the present invention over the prior art.

Figure 1:
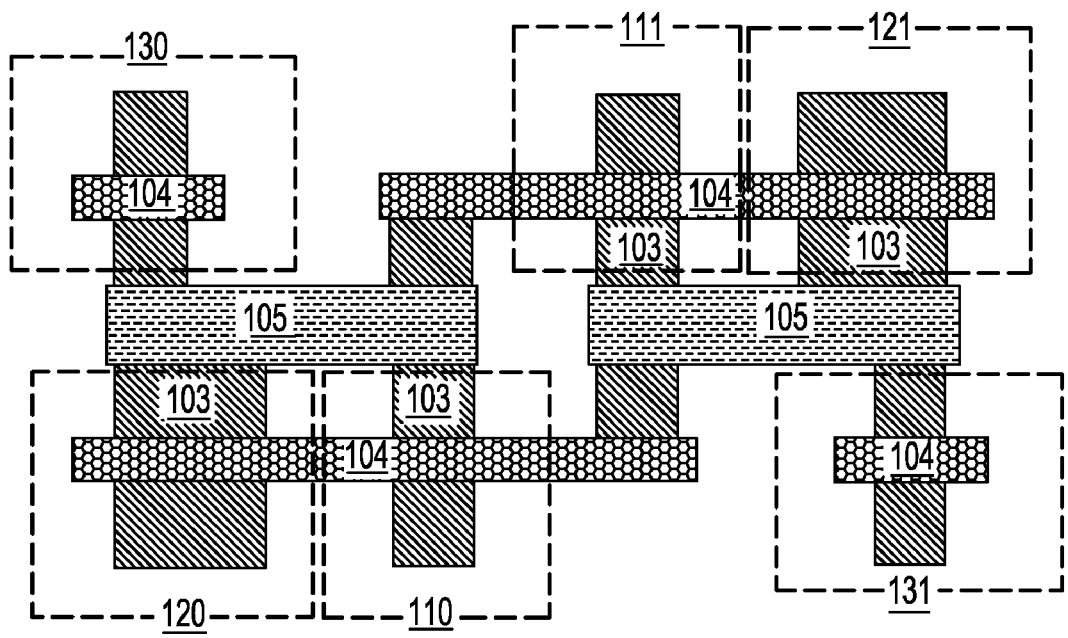
FIG. 1 is a top-down view of a prior art SRAM structure utilizing planar MOSFETs.

Referring to FIG. 1, a top-down schematic view of an exemplary six-transistor SRAM structure utilizing planar MOSFETs according to the prior art is shown. Located within the substrate (not shown explicitly) are semiconductor surfaces 103, gate electrodes 104, and a first level of metal wiring 105. These six transistors in the SRAM structure include a first pull up PFET 110, a first pull down NFET 120, a first pass gate NFET 130, a second pull up PFET 111, a second pull down NFET 121, and a second pass gate NFET 131. Noteworthy are the different widths between the semiconductor area for the first pull down NFET 120 and the corresponding semiconductor area for a first pass gate NFET 130 needed to maintain a beta ratio around 2. In addition, the width ratio between the pull down NFETs 120, 121 and the pull up PFETs 110, 111 is also around 2, which gives electric current ratio, gamma, between the pull down NFETs 120, 121 and the pull up PFETs 110, 111 to be about 4.

Typical finFET manufacturing process results in finFETs with semiconductor fins of identical vertical dimension. This is because the physical widths of the semiconductor fins in different finFETs need to be maintained the same to facilitate lithographic patterning of the semiconductor fins. Also, unlike planar MOSFET devices, an increase in the physical widths of the fins does not result in a corresponding increase in the channel width or increased current since the channel is on the sidewalls of the semiconductor fins. Therefore, to maintain a beta ratio of about 2 and/or the gamma ratio of about 4, other methods must be utilized.

Figure 2:
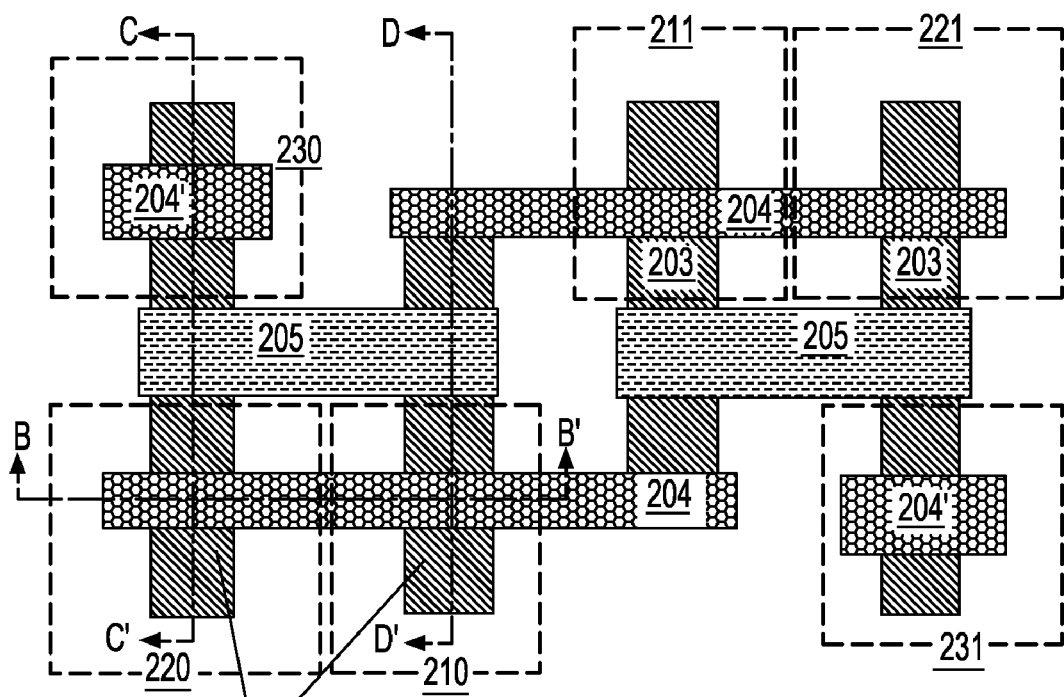
FIG. 2 is a top-down view of prior art SRAM structure utilizing finFETs with different gate lengths.
Figure 3A:
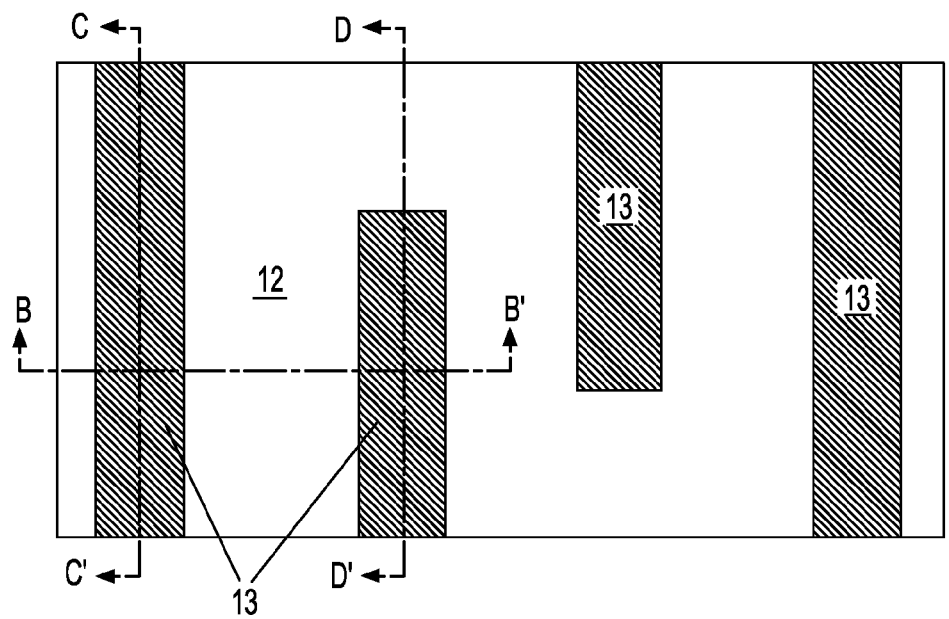
Figure 3B:
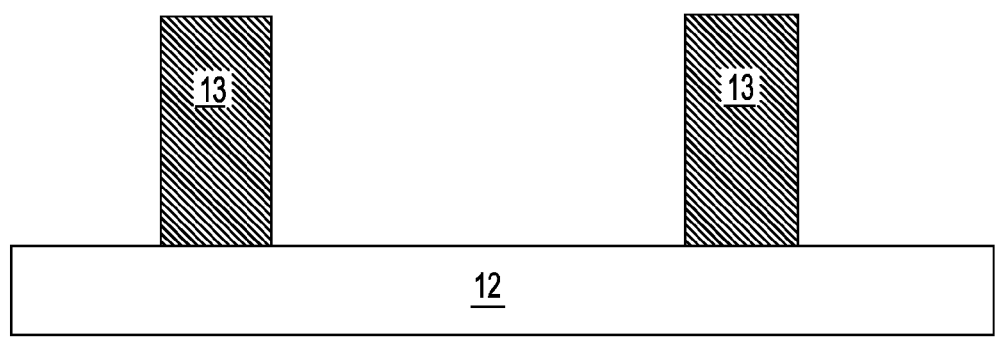
Figure 3C:
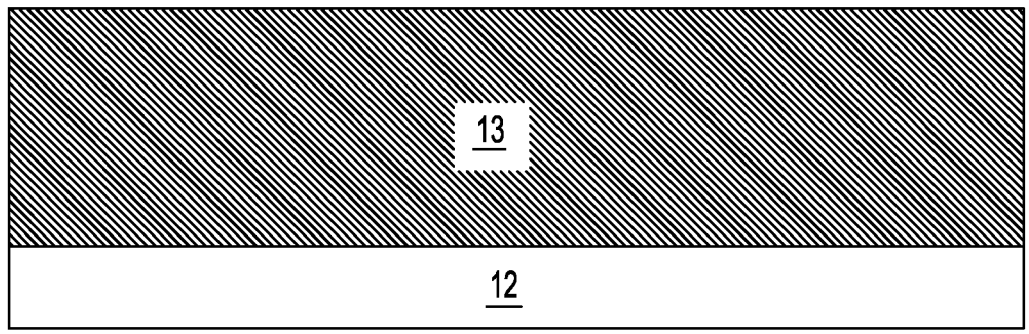
Figure 3D:
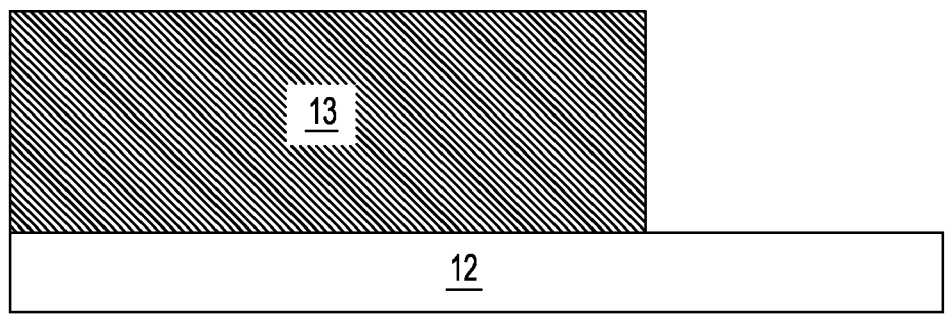
Figure 4A:
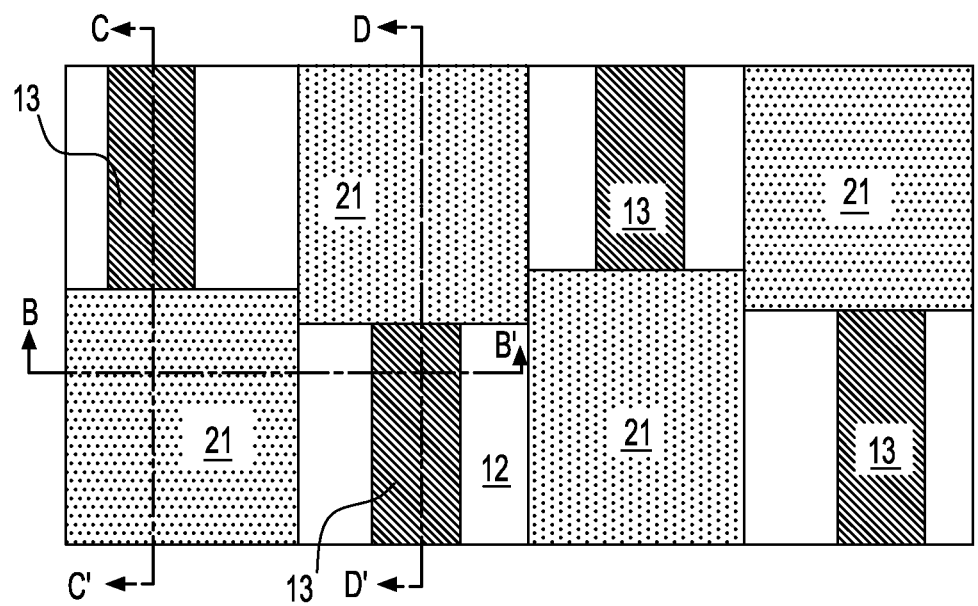
Figure 4B:
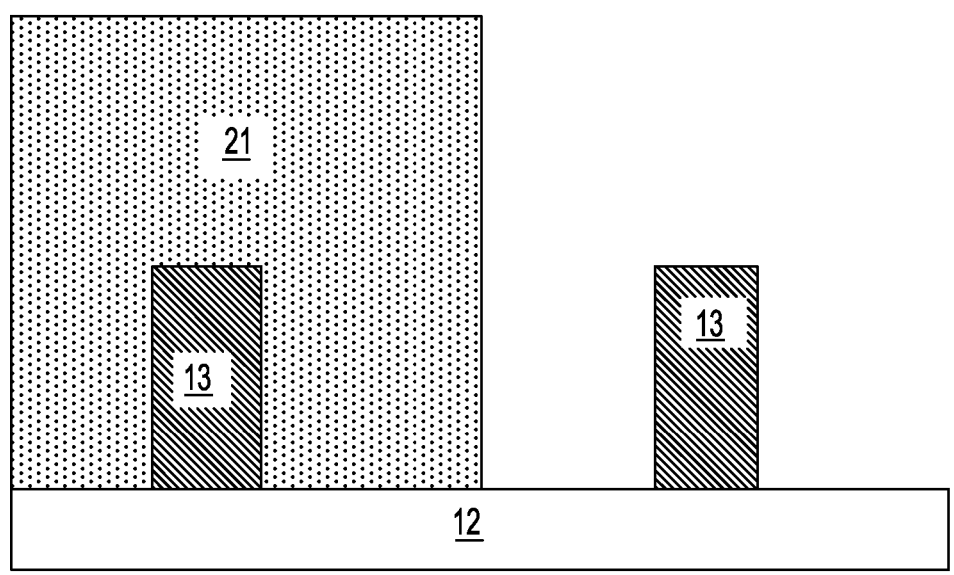
Figure 4C:
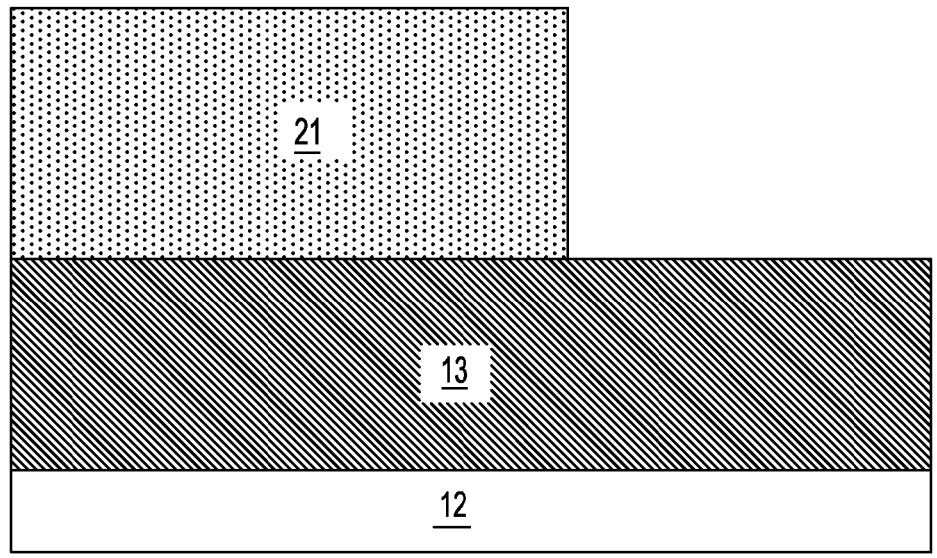
Figure 4D:
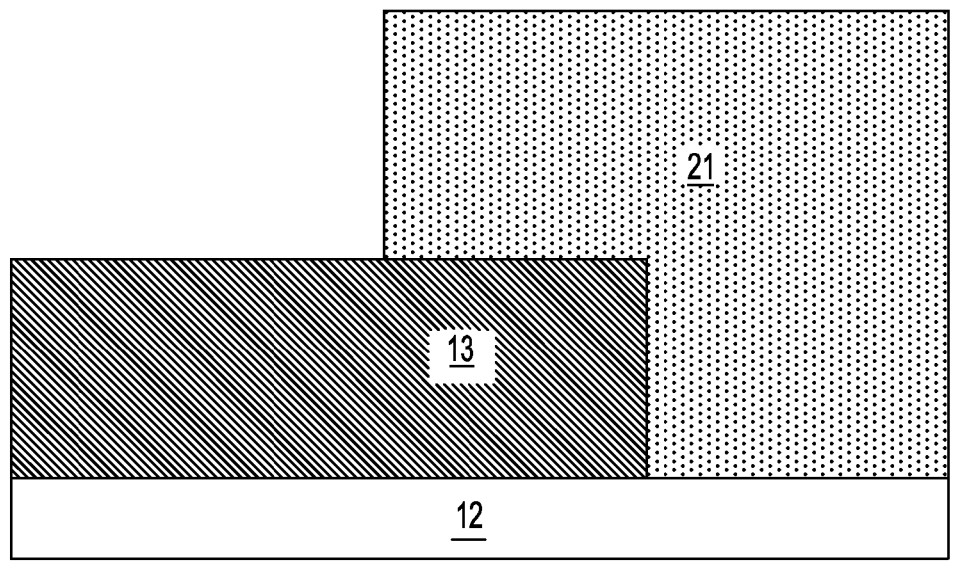
Figure 5A:
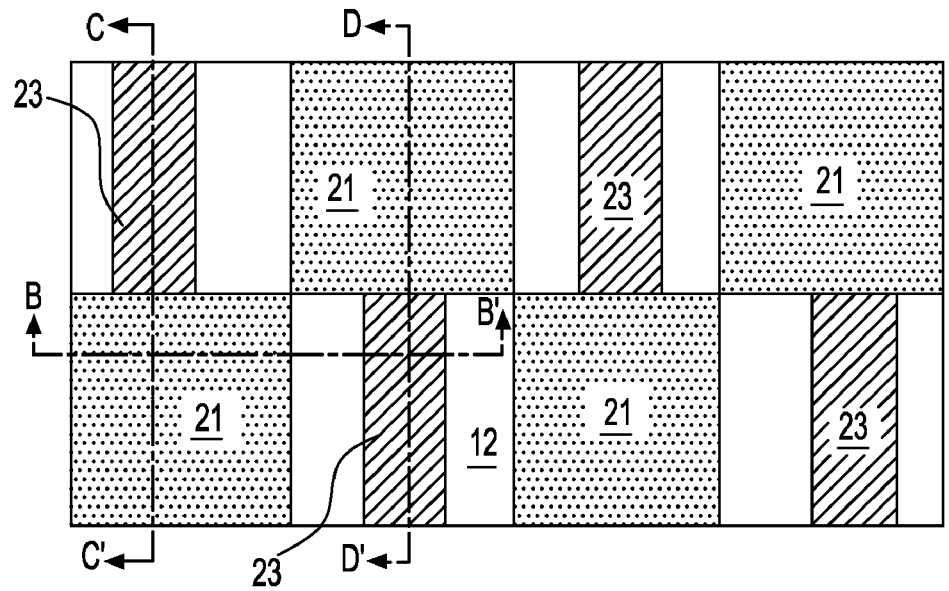
Figure 5B:
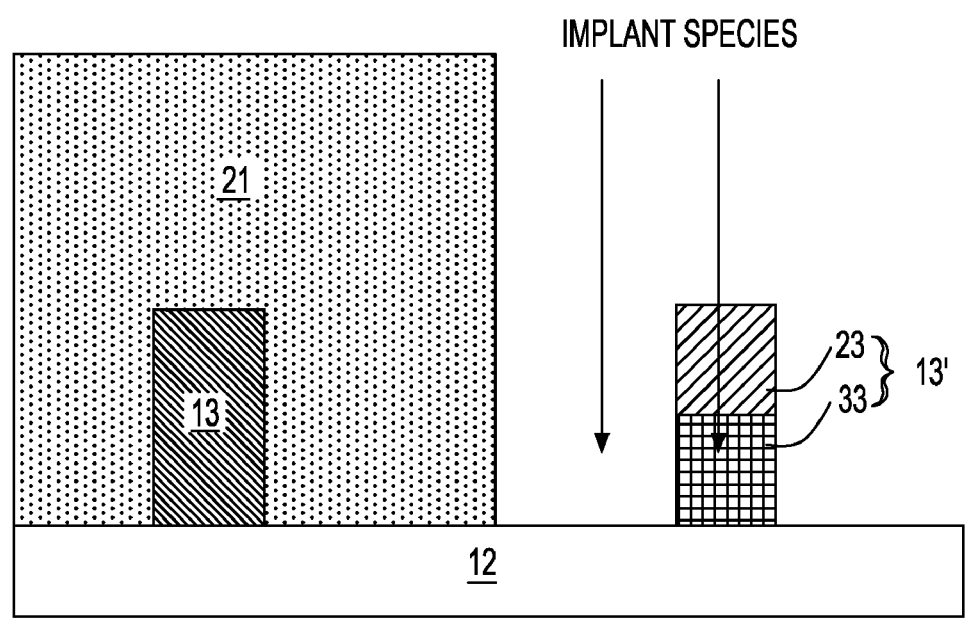
Figure 5C:
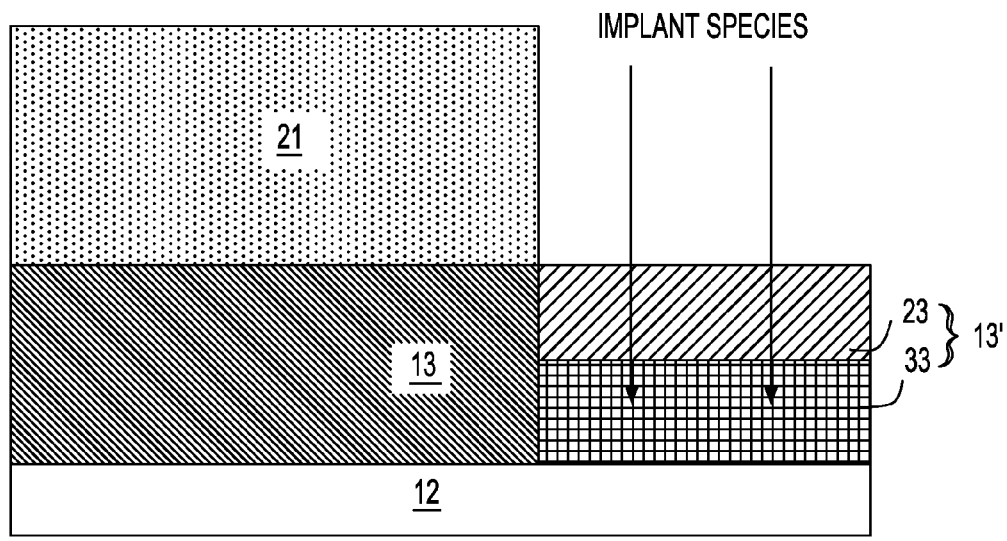
Figure 5D:
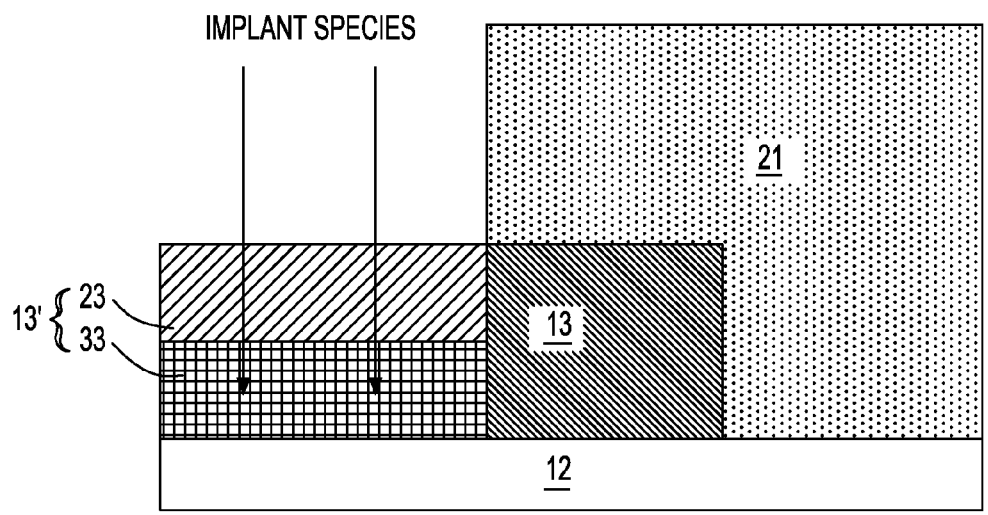
Figure 6A:
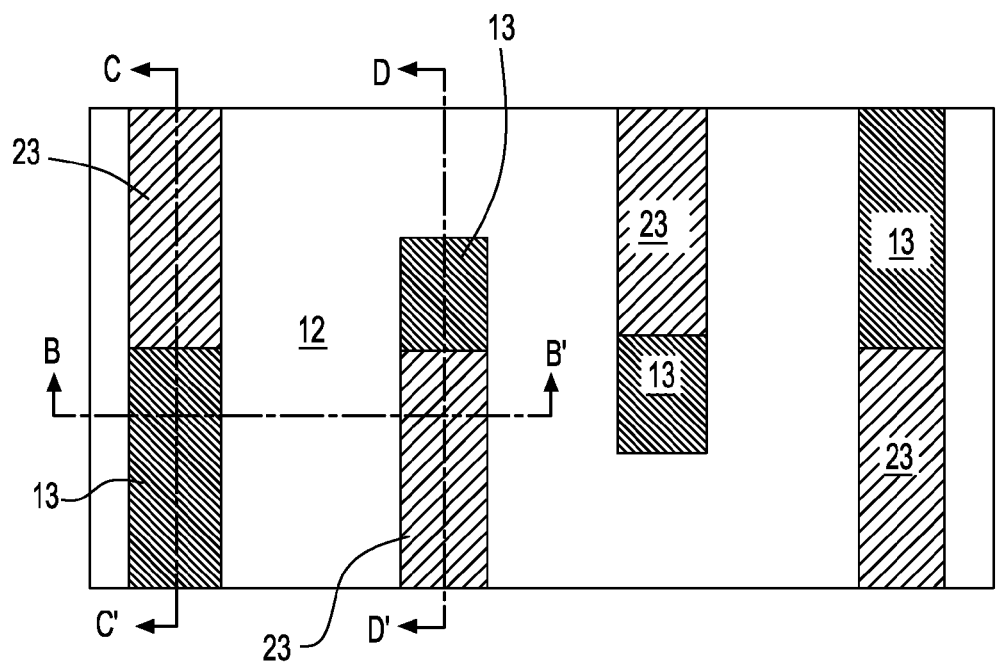
Figure 6B:
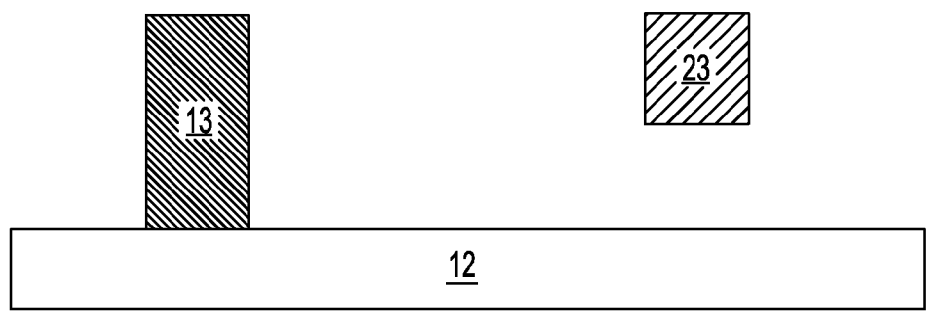
Figure 6C:
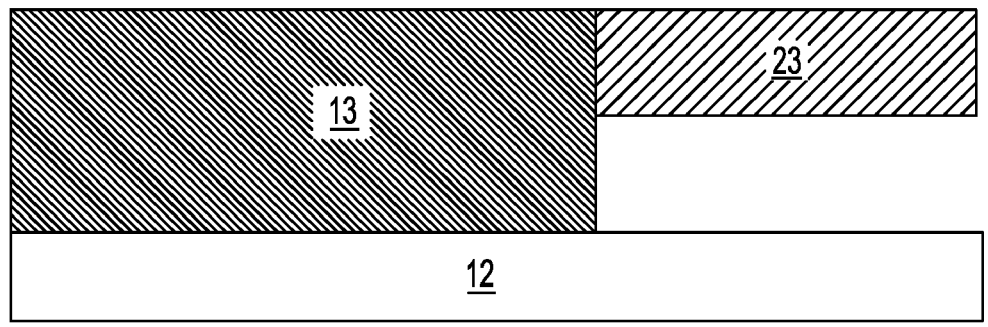
Figure 6D:
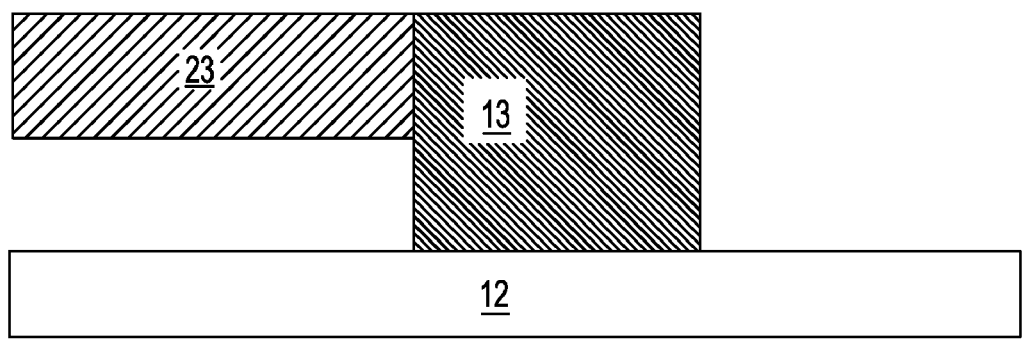
Figure 7A:
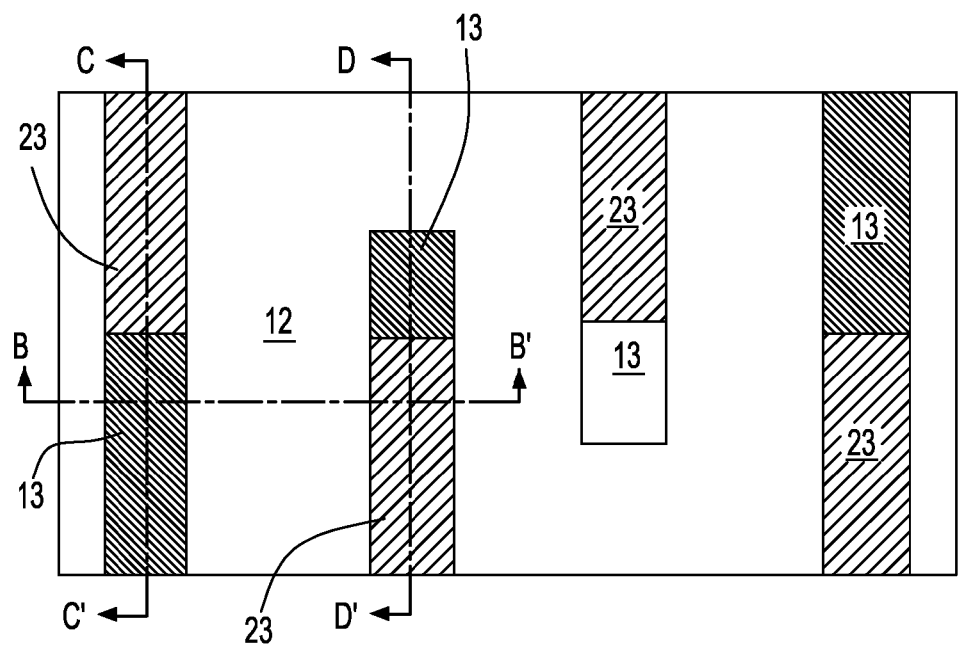
Figure 7B:
Figure 7C:
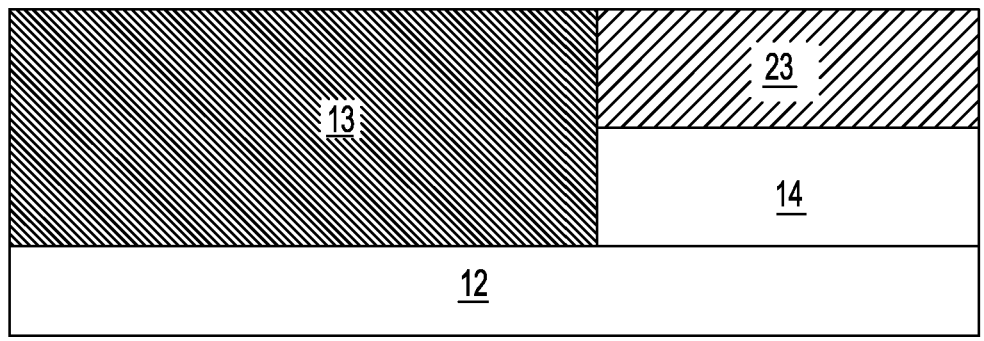
Figure 7D:
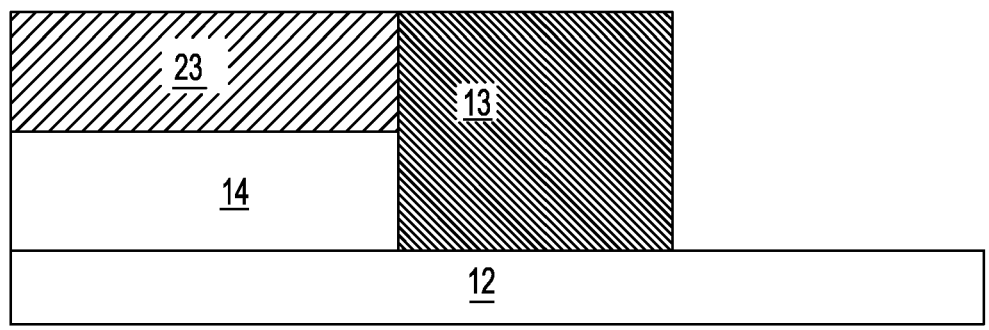

A first approach is to use two semiconductor fins for the pull down NFETs and only one semiconductor fin for the pass gate NFETs. The first approach results in increased layout area for an SRAM structure. A second approach is to weaken the pass gate NFETs (230, 231) by making the channel length longer. Referring to FIG. 2, a top-down schematic view of an exemplary six-transistor SRAM structure utilizing finFETs according to the prior art is shown. These six transistors in the SRAM structure include a first pull up PFET 210, a first pull down NFET 220, a first pass gate NFET 230, a second pull up PFET 211, a second pull down NFET 221, and a second pass gate NFET 231. Top surfaces of semiconductor fins 203, a first level of metal wiring 205, gate electrodes 204 over pull up and pull down FETs (210, 211, 220, 221), and gate electrodes 204' over pass gate NFETs (230, 231) are shown. Noteworthy are the same widths for the semiconductor area for the first pull down NFET 220 and for the corresponding semiconductor area for a first pass gate NFET 230. However, the gate electrodes 204' for the pass gate NFETs (230, 231) are wider compared to the normal gate electrodes 204 for the pull up and pull down FETs (210, 211, 220, 221) so that the pass gate NFETs (230, 231) have longer gate lengths and consequently lower on-current. The second approach also results in an increased layout area for an SRAM structure as well as added variability in the physical dimension of the gate length cause by the use of different channel lengths in the design. A third approach is to weaken the pass gate NFETs by reducing the vertical dimension of the semiconductor fins within the area for the pass gate NFETs. The present invention provides methods and structures according to the third approach with a small number of simple additional processing steps.

The present invention is also described herein with figures for a specific six-transistor SRAM structure. This is because the set of challenges facing the enhancement of SRAM performance is a representative example of the challenges facing typical semiconductor circuits. For example, the transistors in an SRAM cell need to be high performance devices despite their small size, therefore requiring high on-current. At the same time, the beta ratio needs to be kept near 2 and the gamma ratio needs to be kept around 4, showing an example of a circuit requiring transistors of different size in close proximity within the same semiconductor structure.

Despite the fact that the main body of this disclosure is described using a specific SRAM structure, it should be recognized by those skilled in the art that the methods and structures for semiconductor fins of different vertical dimension can be applied to any circuit utilizing requiring finFETs of different on-currents, such as analog circuits.

According to the first embodiment of the present invention, a six-transistor SRAM structure at an initial stage of manufacturing process is shown in FIGS. 3A-3D. In FIGS. 3A-3D, multiple semiconductor fins 13 are formed on a buried oxide (BOX) layer 12 of a semiconductor-on-insulator substrate by lithographically patterning and etching the semiconductor material above the BOX layer 12. The semiconductor material below the BOX layer 12 is not shown in the figures. Each of the semiconductor fins 13 has a flat top surface and a rectangular cross-sectional area. Preferably but not necessarily, the vertical dimension of the semiconductor fins 13 is greater than the width of the semiconductor fins 13 to deliver a high on-current from a wide channel to be formed on portions of the sidewalls or on the entire sidewalls of the semiconductor fins 13.

While formation of finFETs on a bulk substrate is possible, finFETs according to the present invention are preferably formed on a semiconductor substrate comprising a semiconductor-on-insulator substrate. The present invention does allow the use of a hybrid substrate wherein different portions of semiconductor material above the BOX layer 12 may comprise different semiconductor materials. While multiple fins comprising different semiconductor material is with the scope of the present invention, the present invention is described with the same semiconductor material in the semiconductor fins 13. The semiconductor material comprising semiconductor fins 13 may be one of the following: silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

According to the first embodiment of the present invention, a photoresist 21 is applied to the semiconductor substrate and lithographically patterned as shown in FIGS. 4A-4D. Specifically, in the exemplary six-transistor SRAM structure, the pull-down NFETs are masked with a photoresist 21, while the photoresist 21 is removed from the area for the pull-up PFETs and the pass gate NFETs. The patterned photoresist 21 may comprise photoresist materials that are conventional in the art. Typically, the patterned photoresist 21 has a thickness from about 300 nm to about 1500 nm. The thickness of the patterned photoresist 21 is chosen such that implantation of an implant species in the succeeding step does not reach the top of the semiconductor fins 13 under the patterned photoresist 21.

Thereafter, an implant species is implanted into the exposed semiconductor fins 13', i.e., the semiconductor fins 13' that are not covered by the photoresist 21. In the exemplary six-transistor SRAM structure, the pull-up PFETs and the pass gate NFETs are exposed to the ion implantation of the implant species as shown in FIGS. 5A-5D. The pull-down NFETs are masked with a photoresist 21 and therefore, blocked from the ion implantation of the implant species. Also, the implant energy is chosen such that the majority of the implant species stops in a bottom portion 33 of the semiconductor fin that includes the bottom of the exposed semiconductor fins 13'. Alternatively, a hard mask process may be employed instead in combination with gas phase doping or plasma doing to deliver dopants into the exposed semiconductor fins 13' instead of the soft mask process described above.

The vertical dimension of the top portion 23 of the semiconductor fin that includes a negligible amount of the implant species after the implantation is less than 90 percent of the vertical dimension of the semiconductor fins 13 under the photoresist 21, and preferably between 20 percent and 80 percent of the vertical dimension of the semiconductor fins 13 under the photoresist 21, and most preferably, between 30 percent and 70 percent of the vertical dimension of the semiconductor fins 13 under the photoresist 21. The vertical dimension of the top portion 23 of the semiconductor fin that includes a negligible amount of the implant species after the implantation includes the top surfaces of the semiconductor fins 13. After the implant, the exposed semiconductor fin 13' comprises a top portion 23 with none or a negligible amount of the implant species and the bottom portion 33 that comprises an alloy of the implant species and the original semiconductor material within the semiconductor fin 13'. The vertical dimension of the exposed semiconductor fins 13' and the vertical dimension of the semiconductor fins 13 under the photoresist 21 are substantially the same.

The implant species is chosen such that the alloy of the implant species and the semiconductor material formed within the implanted bottom portion 33 of the exposed semiconductor fins 13' can be etched faster than the semiconductor materials without the implant species during a subsequent selective etch process. The semiconductor materials without the implant species are present both in the semiconductor fins 13 that were not exposed to the implantation of the implant species, which are called "first type semiconductor fins" hereafter, and in the top portion 23 of the exposed semiconductor fins 13' that were exposed to the implantation of the implant species, which are called "second type semiconductor fins" hereafter. Therefore, the selective etch process, while etching the alloy of the implant species and the semiconductor material in the bottom portion 33 of the exposed semiconductor fins 13', needs to be selective to, i.e., should etch only minimal amounts or none of, both the semiconductor material in the first type semiconductor fins 13 and the semiconductor material in the top portion 23 of the second type semiconductor fins 13'.

At this point, the photoresist 21 is preferably removed. The bottom portion 33 of the second type semiconductor fins 13' is exposed to the selective etch process having the properties described above. After the selective etch, the bottom portion 33 of the second type semiconductor fins 13' is removed as shown in FIGS. 6A-6D. In one example of the first embodiment of the present invention, the substrate is a silicon-on-insulator substrate with a BOX layer 12 comprising silicon oxide. The first type semiconductor fins 13 and the second type semiconductor fins 13' comprise single crystalline silicon. The implant species comprises germanium. The dose of the germanium implant is such that the germanium content in the bottom portion 33 of the second type semiconductor fins 13' contains from about 0.5% to about 20% of germanium in atomic concentration, and preferably from about 1% to about 10% of germanium in atomic concentration, and most preferably from about 2% to about 4% in atomic concentration. The selective etch process is a reactive ion etch (RIE) process containing $CH_xF_y$ gases such as $CF_4$ and $CHF_3$. Selectivity of about 10:1 up to about 40:1 for germanium containing silicon over pure silicon material with such RIE chemistry is known in the art.

The top portion 23 of the second type semiconductor fins 13' comprising substantially the same semiconductor material as before the implant, and the semiconductor material in the first type semiconductor fins 13 are not etched in any substantial manner during the selective etch. Preferably, the amount of etched semiconductor material from these structures is minimal, and most preferably, the etched amount is none.

At this point, only the top portion 23 remains from the second type semiconductor fins 13'. Therefore, the vertical dimension of the top portion 23 of the second type semiconductor fins 13' is the vertical dimension of the second type semiconductor fins 13' themselves. The vertical dimension of the first type semiconductor fins 13 is, however, substantially identical to the original vertical dimension of the first type semiconductor fins 13. The resulting structure has shortened semiconductor fins, or semiconductor fins of reduced vertical dimension, for the second type semiconductor fins 13'. According to the first embodiment of the present invention, after the loss of the bottom portion 33, the vertical dimension of the second type semiconductor fins 13' is less than 90 percent of the vertical dimension of the first type semiconductor fins 13, and preferably between 20 percent and 80 percent of the vertical dimension of the first type semiconductor fins 13, and most preferably, between 30 percent and 70 percent of the vertical dimension of the first type semiconductor fins 13. To prevent the falling of the remaining top portion 23 from the second type semiconductor fins due to lack of mechanical support, at least one side of the semiconductor 13' is structurally connected to a first type semiconductor fin 13. Therefore, the second semiconductor fins are contiguously adjoined to at least one of the first semiconductor fins.

In the description of the present invention, the word "height" refers to the location of a component as measured from the surface of the semiconductor substrate in the direction perpendicular to the semiconductor substrate. The word vertical dimension refers to the dimension inherent to the component itself without reference to the relative location of the component to other components or to the substrate. Therefore, the vertical dimension of a semiconductor fin is measured from the bottom surface of the fin to the top surface of the fin without reference to any other component. However, the height of the top or bottom of the semiconductor fin is measured in reference to other component of the structure, e.g., the top surface of the underlying substrate.

A feature of the present invention is that the height of the top surfaces of the first type semiconductor fins 13 and the height of the top surfaces of the second type semiconductor fins 13' are equal as shown in the figures. Since the top surface of the BOX layer 12 is flat, i.e., of the same vertical height from the backside surface of the semiconductor substrate, the heights of the top surfaces of the first type and second type semiconductor fins 13, 13' can be readily measured from the top surface of the BOX layer 12. This is the "full" dimension of the semiconductor fin that only the first type semiconductor fins 13 have. The second type semiconductor fins have "reduced" vertical height, which is less than the full height of the semiconductor fins. The difference in the vertical dimension of the first type semiconductor fins 13 and the vertical dimension of the second type semiconductor fins 13' results from the differences in the height of the bottom surfaces of these semiconductor fins 13, 13'. As a result of the removal of the bottom portion 33 of the second type semiconductor fins 13', a space (a void) is formed between the bottom surface of each of the second type semiconductor fins 13' and the BOX layer 12. The height of the bottom of the space under the second type semiconductor fins 13' is at this point the same as the height of the bottom of the first type semiconductor fins 13 and is the same as the top surface of the underlying BOX layer 12.

Preferably, a dielectric material 14 is then deposited to fill the space between the bottom surfaces of second type semiconductor fins 13' and the BOX layer 12. The dielectric material 14 may be an oxide, a nitride, an oxynitride, or a stack thereof. Preferably, the dielectric material 14 is deposited by a chemical vapor deposition (CVD) process. The dielectric material 14 covering the sidewalls of the first type semiconductor fins 13 and the second type semiconductor fins 13' is etched by an etch process to expose the semiconductor surfaces from semiconductor fins of both types 13, 13'. The etch process for the removal of the dielectric film from the sidewalls of the semiconductor fins 13, 13' may be effected by a wet etch or by a RIE. Preferably, the etch process for the removal of the dielectric film from the sidewalls of the semiconductor fins 13, 13' is effected by an RIE. Preferably, the height of the bottom of the dielectric material 14 under the second type semiconductor fins 13' is the same as the height of the bottom of the first type semiconductor fins 13 and also coincides with the height of the top surface of the underlying BOX layer 12. The resulting structure is shown in FIGS. 7A-7D.

Thereafter, a gate dielectric 16 is formed on the sidewalls and on the top surfaces of the first type semiconductor facets 13 and the second type semiconductor facets 13'. The gate dielectric 16 may be a thermally grown oxide or it may be a high-K dielectric material deposited by a chemical vapor deposition (CVD) or an atomic layer deposition (ALD). Preferably, the gate dielectric 16 comprises at least one material selected from the group consisting of $SiO_2$, oxynitride, $HfO_2$, $ZrO_2$, $Al_2O_3$, $TiO_2$, $La_2O_3$, $SrTiO_3$, $LaAlO_3$, and mixtures thereof.

A gate conductor stack is deposited and patterned to form a gate electrode 18. The gate electrode 18 is located on and contacts the gate dielectric 16. The gate conductor stack may comprise a polysilicon layer, a stack of a polysilicon layer and a silicide layer or a stack containing a metal. Preferably, the gate electrode 18 is a metal gate electrode, in which the metal gate electrode is located on and contacts the gate dielectric and comprises at least one material selected from the group consisting of polysilicon, TaN, TiN, WN, other refractory metal nitrides, and mixtures thereof.

Typical gate conductor stacks comprising a polysilicon layer have a thickness of about 100 nm. A photoresist is applied and lithographically patterned followed by a gate stack etch to form gate electrodes 18.

Figure 8A:
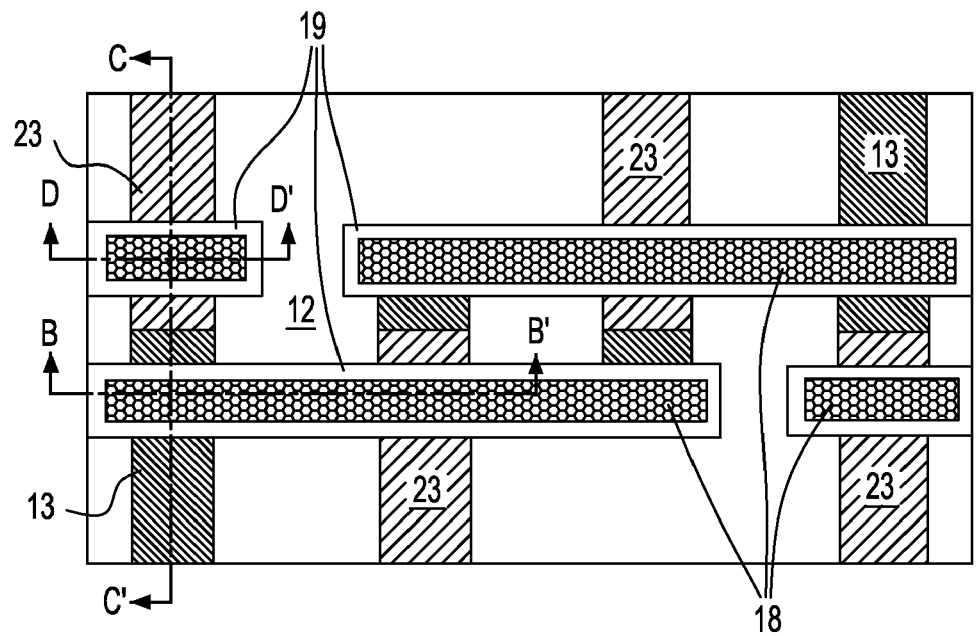
FIG. 8A is a top down view of an SRAM structure utilizing finFETs with different vertical dimensions for the fins according to a first embodiment of the present invention.
Figure 8B:
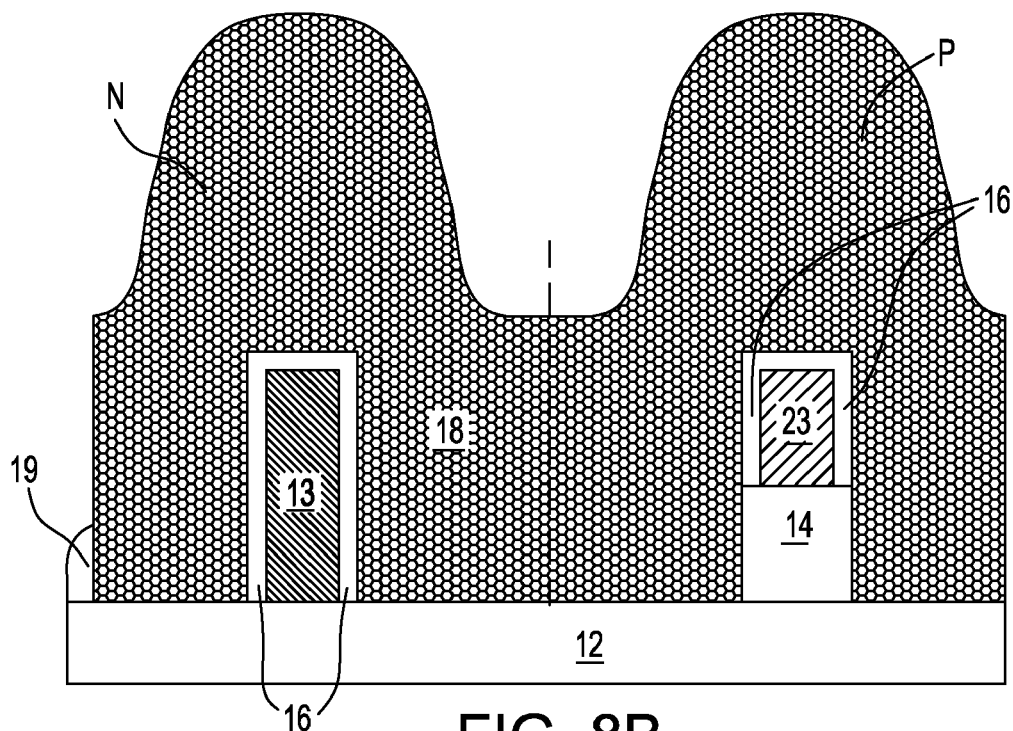
FIG. 8B is a cross-sectional view of the SRAM structure utilizing finFETs according to a first embodiment of the present invention along the line B-B' in FIG. 8A.
Figure 8C:
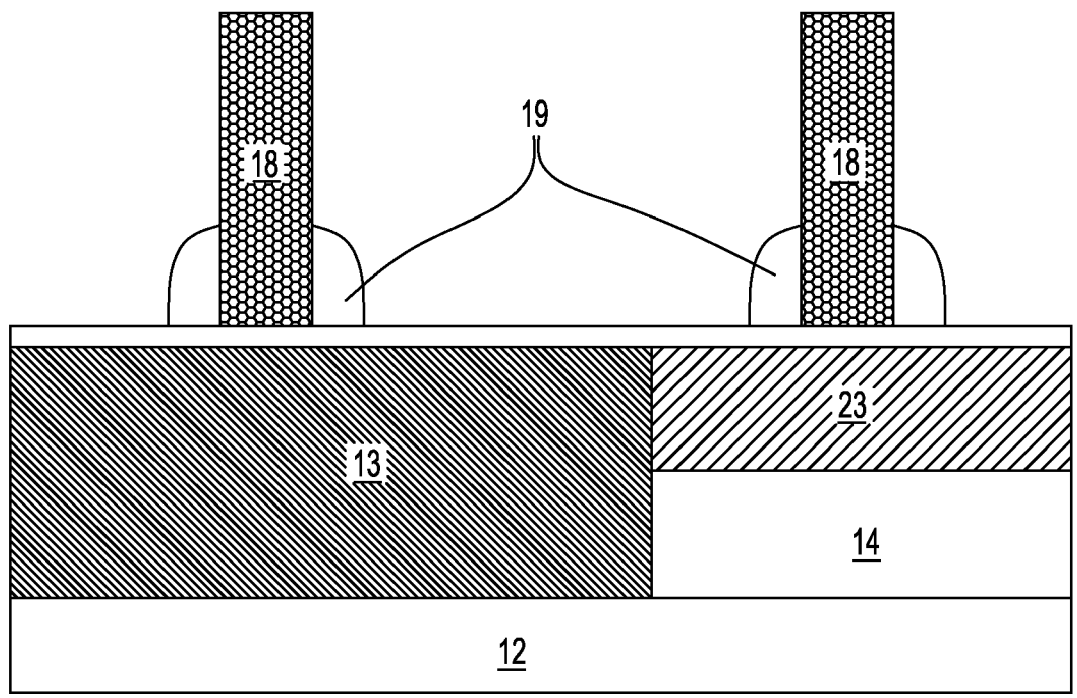
FIG. 8C is a cross-sectional view of the SRAM structure utilizing finFETs according to a first embodiment of the present invention along the line C-C' in FIG. 8A.
Figure 8D:
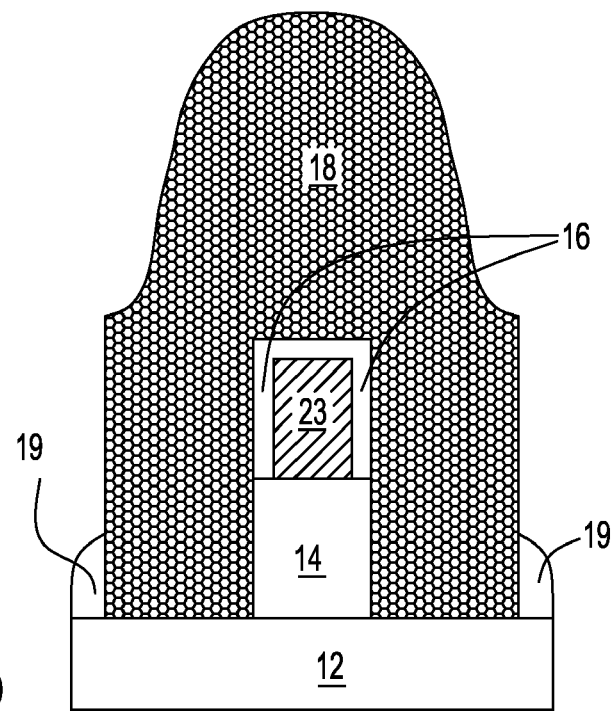
FIG. 8D is a cross-sectional view of the SRAM structure utilizing finFETs according to a first embodiment of the present invention along the line D-D' in FIG. 8A.
Figure 9A:
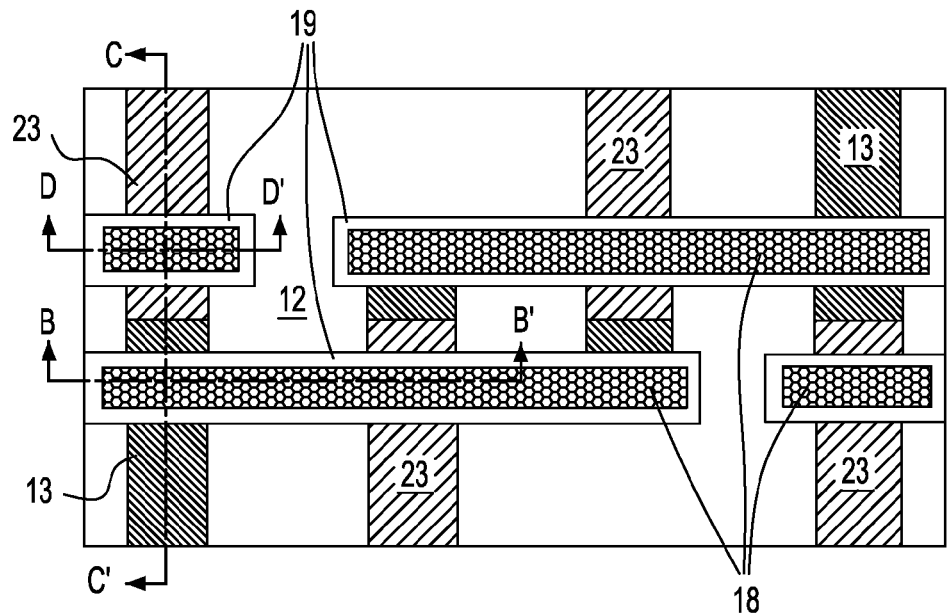
FIG. 9A is a top down view of an SRAM structure utilizing finFETs with different vertical dimensions for the fins according to a second embodiment of the present invention.
Figure 9B:
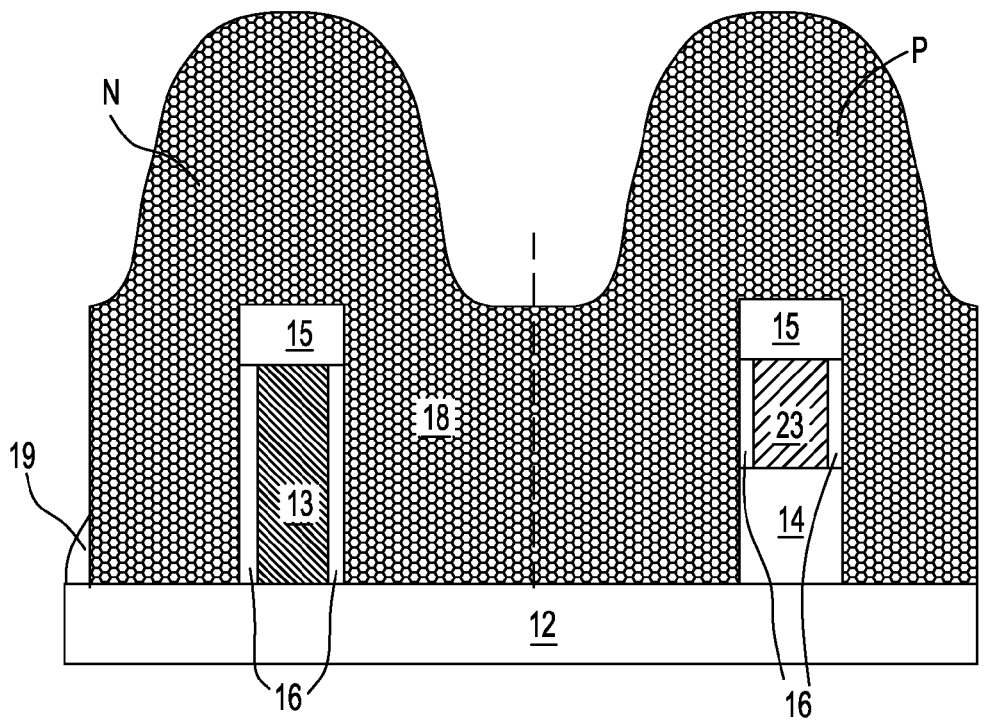
FIG. 9B is a cross-sectional view of the SRAM structure utilizing finFETs according to a second embodiment of the present invention along the line B-B' in FIG. 9A.
Figure 9C:
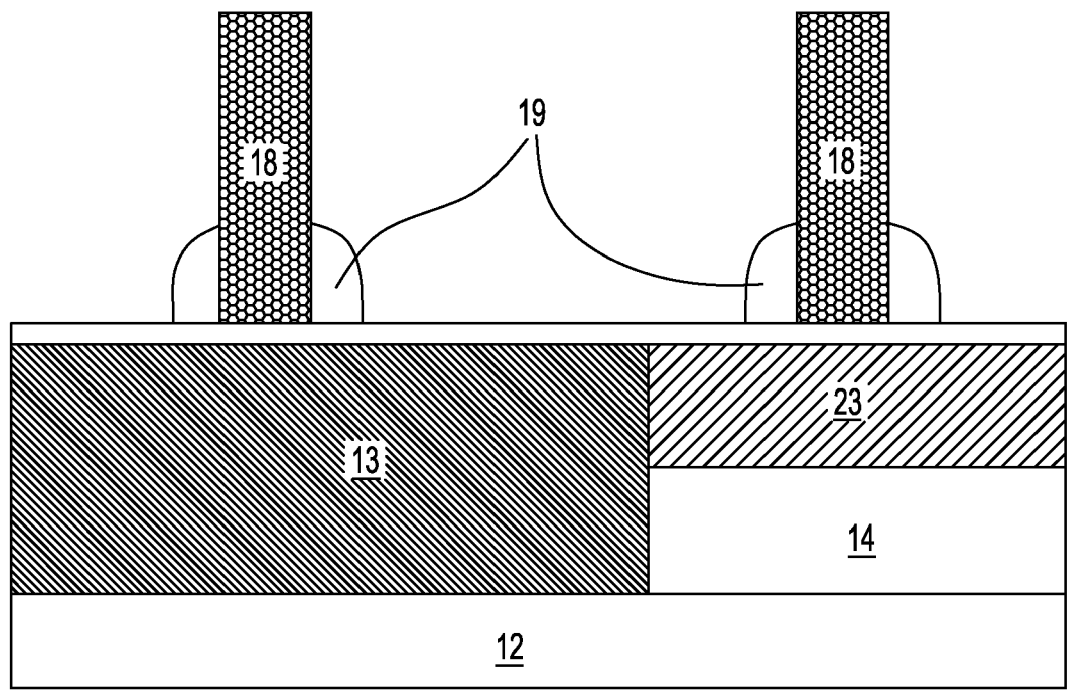
FIG. 9C is a cross-sectional view of the SRAM structure utilizing finFETs according to a second embodiment of the present invention along the line C-C' in FIG. 9A.
Figure 9D:
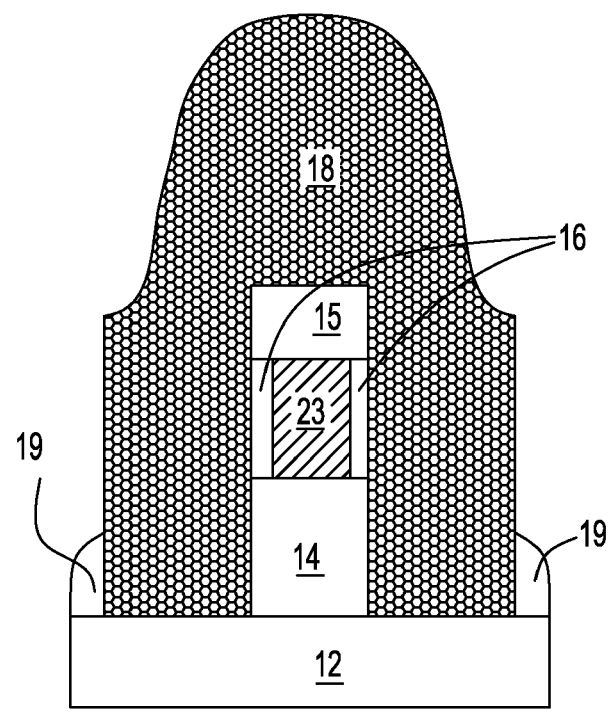
FIG. 9D is a cross-sectional view of the SRAM structure utilizing finFETs according to a second embodiment of the present invention along the line D-D' in FIG. 9A.

Halo and extension implants follow the formation of the gate electrode 18. Halo and extension implants are performed separately for the n-type finFETs and for the p-type finFETs. Thereafter, spacers 19 are formed by deposition of a spacer dielectric and a spacer RIE. The spacers may be formed in one deposition and one RIE or alternatively, in multiple depositions of different spacer dielectric layers and multiple RIEs with further halo or extension implants in between. Typical spacer dielectric material comprises oxide, nitride, oxynitride and a stack thereof. FIGS. 8A-8D show the structure of the exemplary SRAM structure according to the first embodiment of the present invention without showing the details for halo or extension implanted areas. If the gate electrode 18 comprises a polysilicon layer, the p-type finFETs and n-type finFETs are doped differently as shown in FIG. 8B. Typically, the polysilicon gate of an n-type finFET, labeled "N" in FIG. 8B is doped with n-type dopents and the polysilicon gate of a p-type finFET, labeled "P" in FIG. 8B is doped with p-type dopents. After the formation of the spacers, source/drain implantation is performed. As with the halo and extension implants, the source/drain implants are performed separately for the n-type finFETs and for the p-type finFETs by masking one type of finFET while exposing the other type during each implantation.

According to the first embodiment of the present invention, the gate electrode 18 has an inverted U-shape and contacts the gate dielectric 16 both from the top and from the two sides. Thus, a triple gate finFET structure results. FinFETs with different vertical dimensions of semiconductor fins are obtained wherein the heights of the top surfaces of the finFETs are identical but the bottom surfaces of the finFETs are different. By adjusting the implantation energy and consequently, the depth of the implant species, the vertical dimension of the semiconductor fins 13' with reduced vertical dimension can be modulated for device tuning. If more than two vertical heights are necessary, multiple implant masks with different implant energy for the implant species may be utilized to create finFETs with as many different vertical dimensions for the semiconductor fins therein.

According to the second embodiment of the present invention, prior to patterning of the semiconductor fins 13, an insulator layer, which is herein called "a top dielectric layer" 15, is formed either by growth or by deposition. Thermal silicon oxide is typical if growth is used, while various other dielectric materials such as a CVD oxide and a CVD nitride are available if a deposition process is used. The top dielectric layer 15 is patterned along with the semiconductor fins 13 and stays on top of the semiconductor fins as part of the structure throughout the processing steps to be integrated into the final structure as shown in FIGS. 9A-9D. Identical processes are employed in the second embodiment as in the first embodiment after the formation of the top dielectric layer 15. While FIGS. 9A-9D refers to a case wherein the gate dielectric is a thermally grown oxide, one of ordinary skill in the art would recognize that even with a high-K gate dielectric, wrapping around of the high-K gate dielectric over the top dielectric layer 15 would be the only difference in the structure.

The difference between the first embodiment and the second embodiment of the present invention is the use of the top surfaces of the semiconductor fins 13, 13' for a channel of the finFETs. According to the second embodiment of the present invention, the top surface is not used as a channel and a double gate finFET structure results. The features of the availability of finFETs of different vertical dimensions for semiconductor fins and the capability to introduce fins with more than two different vertical dimensions are identical to those according to the first embodiment of the present invention.

According to a third embodiment of the present invention, the implantation of the implant species precedes the formation of the semiconductor fins. In this case, prior to the formation of semiconductor fins, a photoresist is applied and patterned such that the resist covers a first area wherein the first type semiconductor fins are to be formed later. The photoresist is removed from a second area wherein the second type semiconductor fins are to be formed later. The implant species is implanted into the bottom portion of the semiconductor material within the second area. The photoresist is then removed and using another photoresist for the patterning of the semiconductor fins combined with reactive ion etch, semiconductor fins of both types are formed simultaneously. After the formation of the semiconductor fins, the structure according to the second embodiment of the present invention is the same as the structures shown in FIGS. 5A-5D with the only difference being the absence of photoresist 21 shown in FIGS. 5A-5D in the structure obtained according to the third embodiment of the present invention. Subsequently, the processing steps and structures are the same as the first embodiment of the present invention.

According to a fourth embodiment of the present invention, prior to patterning of the semiconductor fins 13, a top dielectric layer is formed either by growth or by deposition in the same fashion as in the second embodiment of the present invention. This is followed by the implantation of the implant species prior to the formation of the semiconductor fins as in the third embodiment of the present invention using the same processing steps. The photoresist is then removed and using another photoresist for the patterning of the semiconductor fins combined with reactive ion etch, semiconductor fins of both types are formed simultaneously. Each of the semiconductor fins has a portion of the top dielectric layer of identical footprint on and over them. After the formation of the semiconductor fins, the structure according to the fourth embodiment of the present invention is similar to the structures shown in FIGS. 5A-5D with the differences being the absence of the photoresist 21 and the presence of a portion of the top dielectric layer on and over the semiconductor fins in the structure obtained according to the fourth embodiment of the present invention. Subsequently, the processing steps and structures are the same as the first embodiment of the present invention.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure, comprising:
at least one first semiconductor fin with a first top surface and a first bottom surface and comprising a semiconductor material and located directly on a planar top surface of an oxide layer that is located in a semiconductor substrate, wherein said semiconductor material of said at least one semiconductor fin contacts said planar top surface, and said first top surface is separated from said planar top surface of said oxide layer by a first height and said at least one first semiconductor fin has a first vertical dimension between said first top surface and said first bottom surface;
at least one second semiconductor fin with a second top surface and a second bottom surface and comprising said semiconductor material and located on said oxide layer, wherein said second top surface is separated from said planar top surface of said oxide layer by a second height and said at least one second semiconductor fin has a second vertical dimension between said second top surface and said second bottom surface, and wherein said first height and said second height are equal and said second vertical dimension is less than said first vertical dimension; and
a dielectric material portion vertically abutting a bottom surface of said at least one second semiconductor fin and said planar top surface of said oxide layer, wherein said at least one second semiconductor fin is separated from said oxide layer by said dielectric material portion.

2. The semiconductor structure of claim 1, wherein said second vertical dimension is less than 90 percent of said first vertical dimension.

3. The semiconductor structure of claim 1, wherein sidewalls of said at least one second semiconductor fins are directly adjoined to sidewalls of said at least one first semiconductor fin.

4. The semiconductor structure of claim 1, wherein said at least one first semiconductor fin and said at least one second semiconductor fin have rectangular cross-sectional area.

5. The semiconductor structure of claim 1, wherein a bottom surface of said dielectric material portion is coplanar with said first bottom surface.

6. The semiconductor structure of claim 1, further comprising a gate dielectric on each sidewall of said at least one first semiconductor fin and said at least one second semiconductor fin.

7. The semiconductor structure of claim 6, wherein said gate dielectric comprises at least one material selected from the group consisting of $SiO_2$, oxynitride, $HfO_2$, $ZrO_2$, $Al_2O_3$, $TiO_2$, $La_2O_3$, $SrTiO_3$, $LaAlO_3$, and mixtures thereof.

8. The semiconductor structure of claim 6, further comprising a gate electrode located on said gate dielectric.

9. The semiconductor structure of claim 8, wherein said gate electrode is a metal gate electrode, wherein said metal gate electrode is located on and contacts said gate dielectric and comprises at least one material selected from the group consisting of polysilicon, TaN, TiN, WN, other refractory metal nitrides, and mixtures thereof.

10. The semiconductor structure of claim 6, wherein said gate dielectric contacts said first top surface and said second top surface.

11. The semiconductor structure of claim 1, wherein said semiconductor substrate comprises a semiconductor-on-insulator substrate.

12. The semiconductor structure of claim 1, wherein said at least one first semiconductor fin and said at least one second semiconductor fin comprise a semiconductor material selected from the group consisting of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

13. The semiconductor structure of claim 3, wherein each sidewall of said at least one second semiconductor fin is coplanar with a sidewall of said at least one first semiconductor fin.

14. The semiconductor structure of claim 1, wherein an entirety of said at least one second semiconductor fin and said at least one first semiconductor fin is single crystalline.

15. The semiconductor structure of claim 1, wherein said dielectric material portion comprises a different material from said oxide layer.

16. The semiconductor structure of claim 15, wherein said dielectric material portion comprises a nitride or an oxynitride, and wherein said oxide layer is silicon oxide.

17. The semiconductor structure of claim 5, wherein said bottom surface of said dielectric material portion is coplanar with said planar top surface of said oxide layer.

18. The semiconductor structure of claim 2, wherein said second vertical dimension is between 20 percent and 80 percent of said first vertical dimension.

* * * * *